United States Patent
Malhotra et al.

(10) Patent No.: US 9,680,436 B1
(45) Date of Patent: Jun. 13, 2017

(54) SYSTEM AND METHOD FOR SETTING ANALOG FRONT END DC GAIN

(71) Applicant: Samsung Display Co., Ltd., Yongin, Gyeonggi-Do (KR)

(72) Inventors: Gaurav Malhotra, Cupertino, CA (US); Amir Amirkhany, Sunnyvale, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/083,211

(22) Filed: Mar. 28, 2016

(51) Int. Cl.
    *H03G 3/30*      (2006.01)
    *H04B 1/16*      (2006.01)
    *H04L 25/03*     (2006.01)

(52) U.S. Cl.
CPC .............. *H03G 3/3036* (2013.01); *H04B 1/16* (2013.01); *H04L 25/03057* (2013.01)

(58) Field of Classification Search
CPC .. H03G 3/3036; H04B 1/16; H04L 25/03006; H04L 25/03057; H04L 25/03949
USPC ....... 375/232, 233, 254, 285, 316, 319, 345, 375/346, 348, 350; 455/130, 226.3, 455/232.1, 295, 296
See application file for complete search history.

(56) References Cited

U.S. PATENT DOCUMENTS

| | | | |
|---|---|---|---|
| 8,705,672 B2 | 4/2014 | Malipatil et al. | |
| 8,737,549 B2 | 5/2014 | Mobin et al. | |
| 8,831,142 B2 | 9/2014 | Kotagiri et al. | |
| 8,837,570 B2 | 9/2014 | Shvydun et al. | |
| 8,837,626 B2 | 9/2014 | Malipatil et al. | |
| 9,025,655 B1 | 5/2015 | Ramadoss et al. | |
| 9,106,462 B1 | 8/2015 | Aziz et al. | |
| 2012/0170621 A1* | 7/2012 | Tracy | H04L 25/03038 375/219 |
| 2012/0230454 A1* | 9/2012 | Mobin | H04L 7/0083 375/354 |
| 2012/0257652 A1* | 10/2012 | Malipatil | H04L 7/0062 375/219 |
| 2013/0148712 A1* | 6/2013 | Malipatil | H04L 25/0307 375/233 |
| 2014/0233619 A1* | 8/2014 | Sindalovsky | H04L 27/01 375/224 |

OTHER PUBLICATIONS

Kimura, H., "A 28 Gb/s 560 mW Multi-Standard SerDes With Single-Stage Analog Front-End and 14-Tap Decision-Feedback Equalizer in 28 nm CMOS," IEEE Journal of Solid-State Circuits, vol. 49, No. 12, Dec. 2014, pp. 3091-3103.

* cited by examiner

*Primary Examiner* — Young T Tse
(74) *Attorney, Agent, or Firm* — Lewis Roca Rothgerber Christie LLP

(57) ABSTRACT

A system and method for setting analog front end in a serial receiver. The serial receiver includes a decision feedback equalizer. During initialization, taps of the decision feedback equalizer other than the zeroth tap are disabled, and the zeroth tap is used to estimate the amplitude of the signal at the output of the analog front end. The analog front end gain is iteratively adjusted until the estimated value of the zeroth tap is within a set range.

20 Claims, 7 Drawing Sheets

SYSTEM AND METHOD FOR SETTING ANALOG FRONT END DC GAIN

FIELD

One or more aspects of embodiments according to the present invention relate to serial data transmission, and more particularly to a system and method for setting the gain of an analog front end in a serial receiver.

BACKGROUND

A high-speed serial link may include a transmitter, a channel, and a receiver. The receiver may include an analog front end (AFE) that feeds one or more clocked comparators or "slicers" in the receiver. The AFE may provide gain and frequency response adjustments of the signal received over the channel.

Variations in manufacturing processes may result in significant variations in AFE gain from chip to chip, which, if not corrected, may result in saturation of the circuits following the AFE, and bit errors in the serial link.

Thus, there is a need for a system and method for setting the gain of an AFE circuit.

SUMMARY

Aspects of embodiments of the present invention are directed toward a system and method for setting the gain of an analog front end in a serial receiver.

According to an embodiment of the present invention there is provided a receiver for a serial link, the receiver having an analog input and including: a first analog front end connected to the analog input and having an output and an adjustable DC gain; a data slicer connected to the output of the analog front end; an error slicer connected to the output of the analog front end; and a first processor unit connected to the data slicer and the error slicer and configured to iteratively: adjust the DC gain; and estimate a zeroth channel tap value, until the zeroth tap value falls into a set range of values, wherein the estimating of the zeroth channel tap value includes iteratively updating an estimated zeroth channel tap value according to the equation: $h0(n+1)=h0(n)+mu*Error*Data$, wherein: $h0(n+1)$ is an updated estimate of the zeroth channel tap value; $h0(n)$ is a previous estimate of the zeroth channel tap value; mu is a constant; Data is the sign of a most recently received data bit; Error is the sign of: $y-h0(n)$ when Data is 1, and $y+h0(n)$ when Data is 0; and y is an analog signal at the output of the analog front end.

In one embodiment, the iterative adjusting of the DC gain includes initializing the DC gain to a first value, and increasing the DC gain with each iteration.

In one embodiment, the increasing the DC gain with each iteration includes increasing the DC gain by a set increment.

In one embodiment, the first value is sufficiently small to avoid saturation of the receiver.

In one embodiment, the iterative adjusting of the DC gain includes initializing the DC gain to a first value, and decreasing the DC gain in fixed increments.

In one embodiment, the iterative adjusting of the DC gain further includes, after the estimated zeroth channel tap value falls below a first threshold, increasing the DC gain by a fixed increment.

According to an embodiment of the present invention there is provided a display including: a transmitter; and a receiver connected to the transmitter, the receiver having an analog input including: a first analog front end connected to the analog input and having an output and an adjustable DC gain; a data slicer connected to the output of the analog front end; an error slicer connected to the output of the analog front end; and a first processor unit connected to the data slicer and the error slicer and configured to iteratively: adjust the DC gain; and estimate a zeroth channel tap value, until the zeroth tap value falls into a set range of values, wherein the estimating of the zeroth channel tap value includes iteratively updating an estimated zeroth channel tap value according to the equation: $h0(n+1)=h0(n)+mu*Error*Data$, wherein: $h0(n+1)$ is an updated estimate of the zeroth channel tap value; $h0(n)$ is a previous estimate of the zeroth channel tap value; mu is a constant; Data is the sign of a most recently received data bit; Error is the sign of $y-h0(n)$ when Data is 1, and $y+h0(n)$ when Data is 0; and y is an analog signal at the output of the analog front end.

In one embodiment, the iterative adjusting of the DC gain includes initializing the DC gain to a first value, and increasing the DC gain with each iteration.

In one embodiment, the increasing the DC gain with each iteration includes increasing the DC gain by a set increment.

In one embodiment, the first value is sufficiently small to avoid saturation of the receiver.

In one embodiment, the iterative adjusting of the DC gain includes initializing the DC gain to a first value, and decreasing the DC gain in fixed increments.

In one embodiment, the iterative adjusting of the DC gain further includes, after the estimated zeroth channel tap value falls below a first threshold, increasing the DC gain by a fixed increment.

In one embodiment, the display includes alternating binary ones and zeros.

According to an embodiment of the present invention there is provided a method of initializing a serial link including a transmitter and a receiver connected to the transmitter, the receiver having an analog input and including: a first analog front end connected to the analog input and having an output and an adjustable DC gain; a data slicer connected to the output of the analog front end; and an error slicer connected to the output of the analog front end; the method including: iteratively: adjusting the DC gain; and estimating a zeroth channel tap value, until the zeroth tap value falls into a set range of values, wherein the estimating of the zeroth channel tap value includes iteratively updating an estimated zeroth channel tap value according to the equation: $h0(n+1)=h0(n)+mu*Error*Data$, wherein: $h0(n+1)$ is an updated estimate of the zeroth channel tap value; $h0(n)$ is a previous estimate of the zeroth channel tap value; mu is a constant; Data is the sign of a most recently received data bit; Error is the sign of: $y-h0(n)$ when Data is 1, and $y+h0(n)$ when Data is 0; and y is an analog signal at the output of the analog front end.

In one embodiment, the iterative adjusting of the DC gain includes initializing the DC gain to a first value, and increasing the DC gain with each iteration.

In one embodiment, the increasing the DC gain with each iteration includes increasing the DC gain by a set increment.

In one embodiment, the first value is sufficiently small to avoid saturation of the receiver.

In one embodiment, the iterative adjusting of the DC gain includes initializing the DC gain to a first value, and decreasing the DC gain in fixed increments.

In one embodiment, the iterative adjusting of the DC gain further includes, after the estimated zeroth channel tap value falls below a first threshold, increasing the DC gain by a fixed increment.

In one embodiment, the method includes: transmitting, by the transmitter, during the estimating of the zeroth channel tap value, a signal including alternating binary ones and zeros.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a system and method for setting analog front end DC gain provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
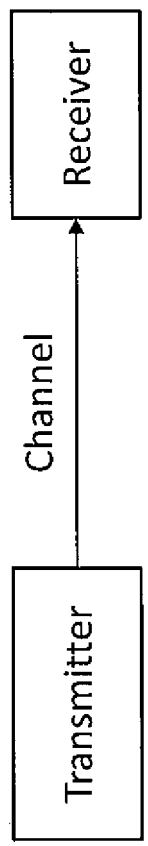
FIG. 1 is a block diagram of a serial link, according to an embodiment of the present invention.

Referring to FIG. 1, in one embodiment a serial data link may include a transmitter, a channel, and a receiver. The transmitter may drive the channel with an output that switches between two states, one state representing binary 0 and one representing binary 1. The channel may be a conductor or a plurality of conductors. The channel may include, for example, a single conductor (e.g., over a ground plane) or it may include two conductors (e.g., a driven conductor and a separate ground conductor), or it may include two driven conductors (e.g., two conductors driven with a differential signal), or three conductors including two driven conductors (e.g., two conductors driven with a differential signal) and a ground conductor.

The channel may have characteristics, such as frequency-dependent loss, or phase dispersion, that may result in inter-symbol interference (ISI), and errors in the received data if measures are not taken to compensate. For example, the receiver may include an analog front end (AFE) that may include an amplifier and a continuous-time linear equalizer (CTLE) for compensating for the loss in the channel, and to equalize the response of the channel. The AFE may have a gain (or "AFE DC gain") that is adjustable. A high value of AFE gain may result in saturation in the receiver, which may cause errors in the received data. A low value of the AFE gain may result in receiver noise being significant relative to the signal; this may also cause errors in the received data. During operation, the AFE DC gain may be set to a value within a range of gain values within which receiver saturation is avoided, and within which the received signal is large compared to receiver noise.

The channel and AFE may be represented by a model composed of (e.g., consisting of) a number of "channel taps" $h_0$, $h_1$, $h_2$, etc., each of which is a coefficient in the discrete-time pulse response of the channel and the AFE. To simplify the terminology, as used herein, a "channel tap" represents the characteristics of the cascade of the channel and the AFE. The zeroth tap value $h_0$ may indicate (e.g., it may be proportional to) the amplitude of the received signal, at the output of the AFE.

Figure 2:
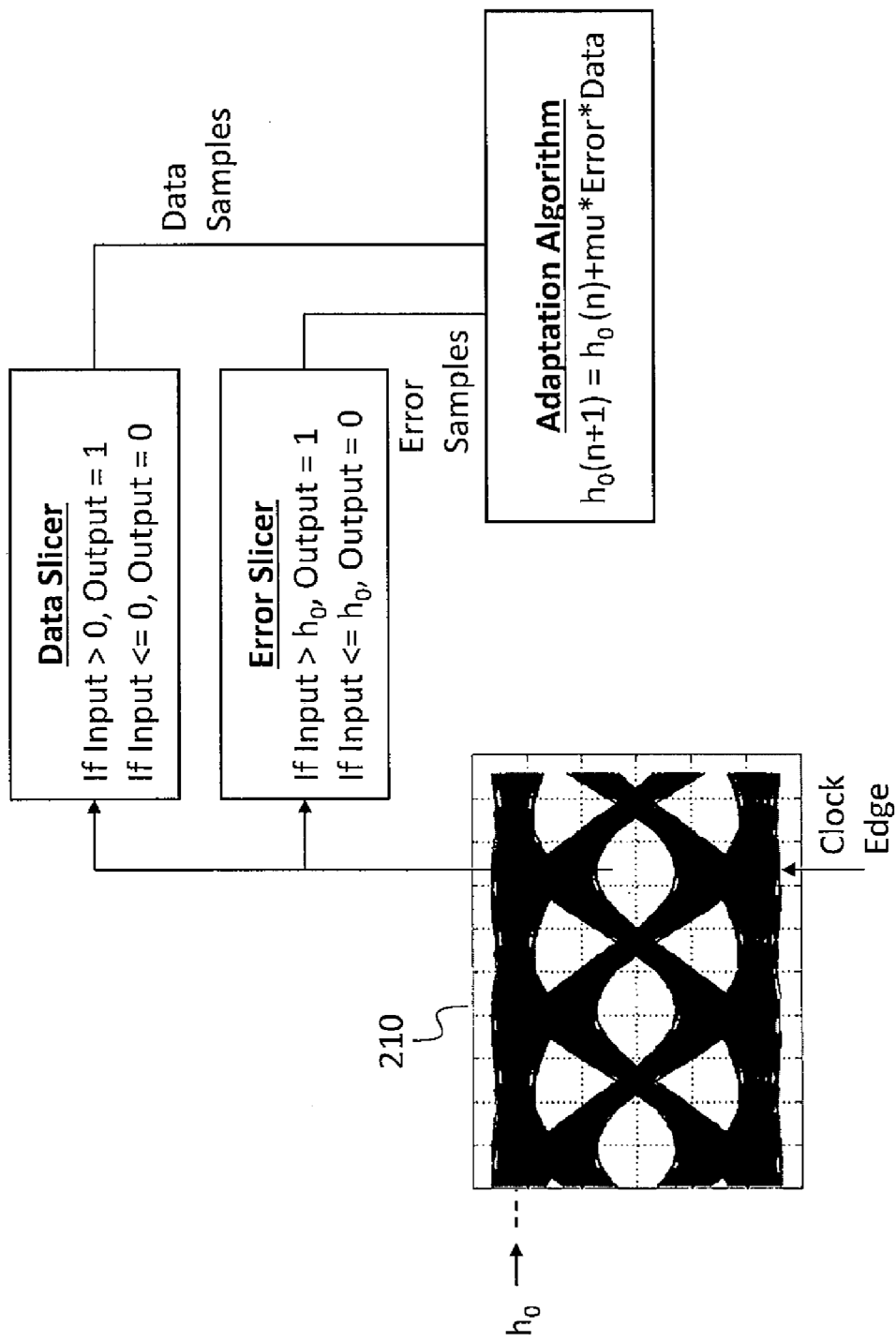
FIG. 2 is a hybrid eye-block diagram of a system for estimating a zeroth channel tap, according to an embodiment of the present invention.

Referring to FIG. 2, in one embodiment, a circuit and/or algorithm estimates the zeroth tap value and adjusts the AFE gain until the zeroth tap value (and the amplitude of the received signal, at the output of the AFE) is within a set or predetermined range. The output of the AFE is connected to a data slicer and an error slicer. At each clock edge, the data slicer compares the value of the analog signal y (i.e., the output of the AFE) to 0, and outputs a binary 1 if the analog signal is greater than 0, and a binary 0 if the analog signal is less than or equal to 0. An error slicer compares the value of the analog signal y to the current estimated value of $h_0$, and outputs a binary 1 if the analog signal is greater than $h_0$, and a binary 0 if the analog signal is less than or equal to $h_0$. An adaptation algorithm then updates the estimated value of $h_0$, using the equation $$h_0(n+1) = h_0(n) + mu^* \text{Error}^* \text{Data}, \quad (1)$$

where Error and Data are the outputs of the error and data slicers, respectively, and where, as will be understood by one of skill in the art, a binary 0 maps into an arithmetic value of −1 for the purpose of evaluating the adaptation algorithm equation (Equation (1)). The binary value "0" and the corresponding arithmetic value "−1" are used interchangeably herein to denote a signal having a binary zero value. In Equations (1) (above) and (2) (below), for example, the arithmetic values of the variables "Error" and "Data" are used. The iterative updating of the estimated value of $h_0$ may be performed at the clock rate of the received data, or at a lower rate, e.g., to conserve power. In Equation (1), mu is a constant that may be selected to achieve an acceptable convergence rate and acceptable stability.

Figure 3A:
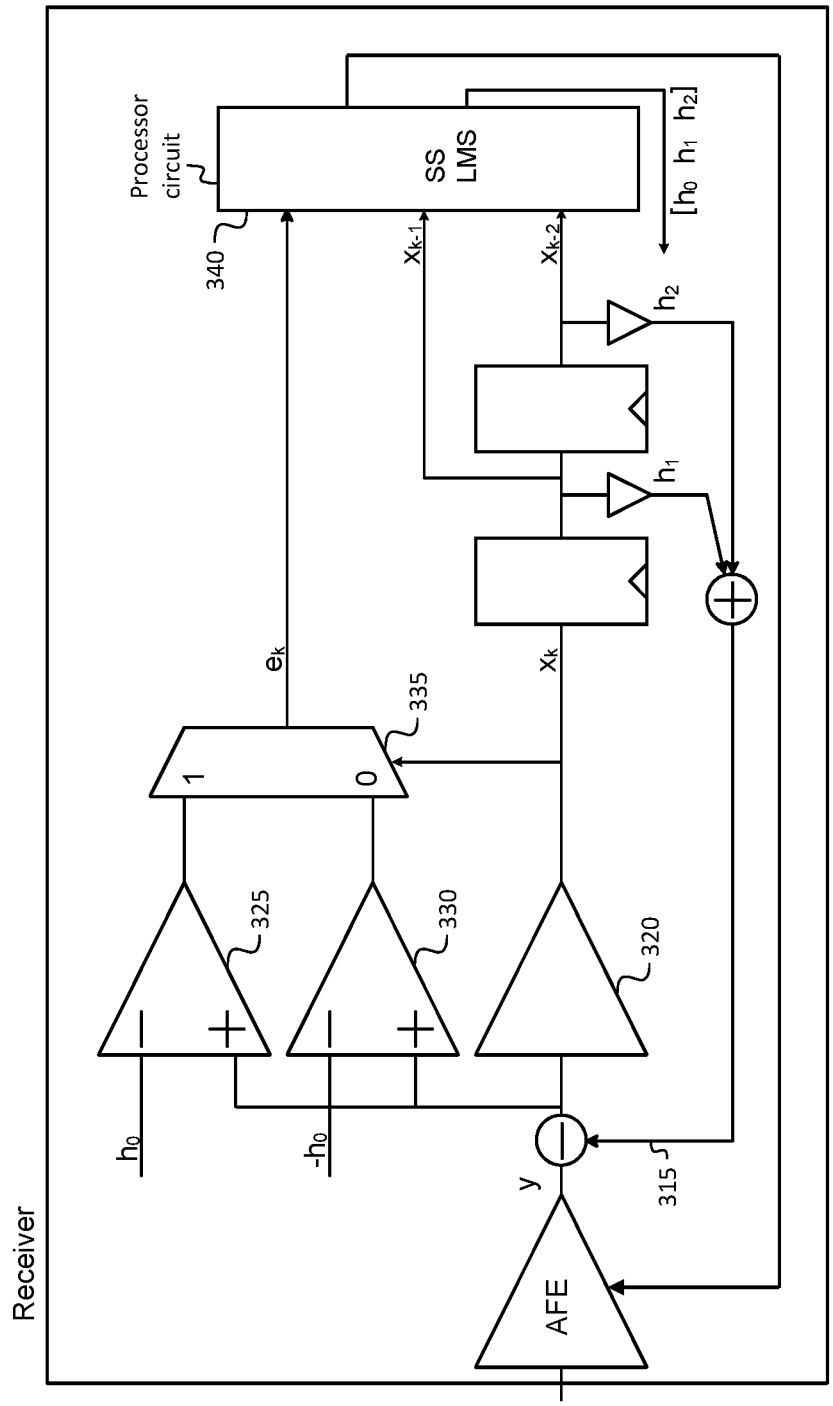
FIG. 3A is a block diagram of a receiver with decision feedback equalization, according to an embodiment of the present invention.

Referring to FIG. 3A, in one embodiment, a receiver with decision feedback equalization (DFE) may employ a method referred to as sign-sign LMS adaptation. The sign-sign LMS algorithm for adaptation is as follows:

$$[h_0 h_1 h_2](n+1) = [h_0 h_1 h_2](n) + mu^* \text{sign}([x_k x_{k-1} x_{k-2}])^* \text{sign}(\text{Error}_k) \quad (2)$$

where $[h_0\ h_1\ h_2](n+1)$ is the vector of estimated tap values at the $(n+1)^{th}$ iteration, mu is a constant step size, and "error$_k$" is the difference between the received signal $y_k$ and the reconstructed signal $[x_k\ x_{k-1}\ x_{k-2}] \bullet [h_0\ h_1\ h_2](n)$ (where "•" represents the dot product, i.e., the sum of the element-by-element products). In Equation (2) the index n identifies the iteration of the adaptation algorithm, and the index k identifies the time step, in increments of the serial data unit interval. The symbols $h_0$, $h_1$, and $h_2$ are used to represent both the true channel taps and the SS LMS estimates for the channel taps. As used herein, the sign function is equal to +1 when its input is a binary 1 or an analog value greater than zero, and it is equal to −1 when its input is a binary 0 or an analog value less than zero.

In the embodiment of FIG. 3A, a correction circuit adds a DFE correction signal 315 (equal to xk−1*h1+xk−2*h2) to the input signal y to mitigate ISI (or, equivalently, subtracts an opposite correction signal from the input signal y). The most recent data value is determined by a data slicer (or "sampler" or "clocked comparator") 320. Two error samplers 325, 330 compare the corrected input signal to h0 and −h0 respectively. The sign ek of the error term Errork (i.e., ek=sign(Errork)) is formed at the output of the multiplexer 335. The estimate h0 of the zeroth channel tap, and the post-cursor DFE taps h1 and h2 are iteratively updated by a processor circuit 350 executing a sign-sign least mean squares (SS LMS) algorithm.

Figure 3B:
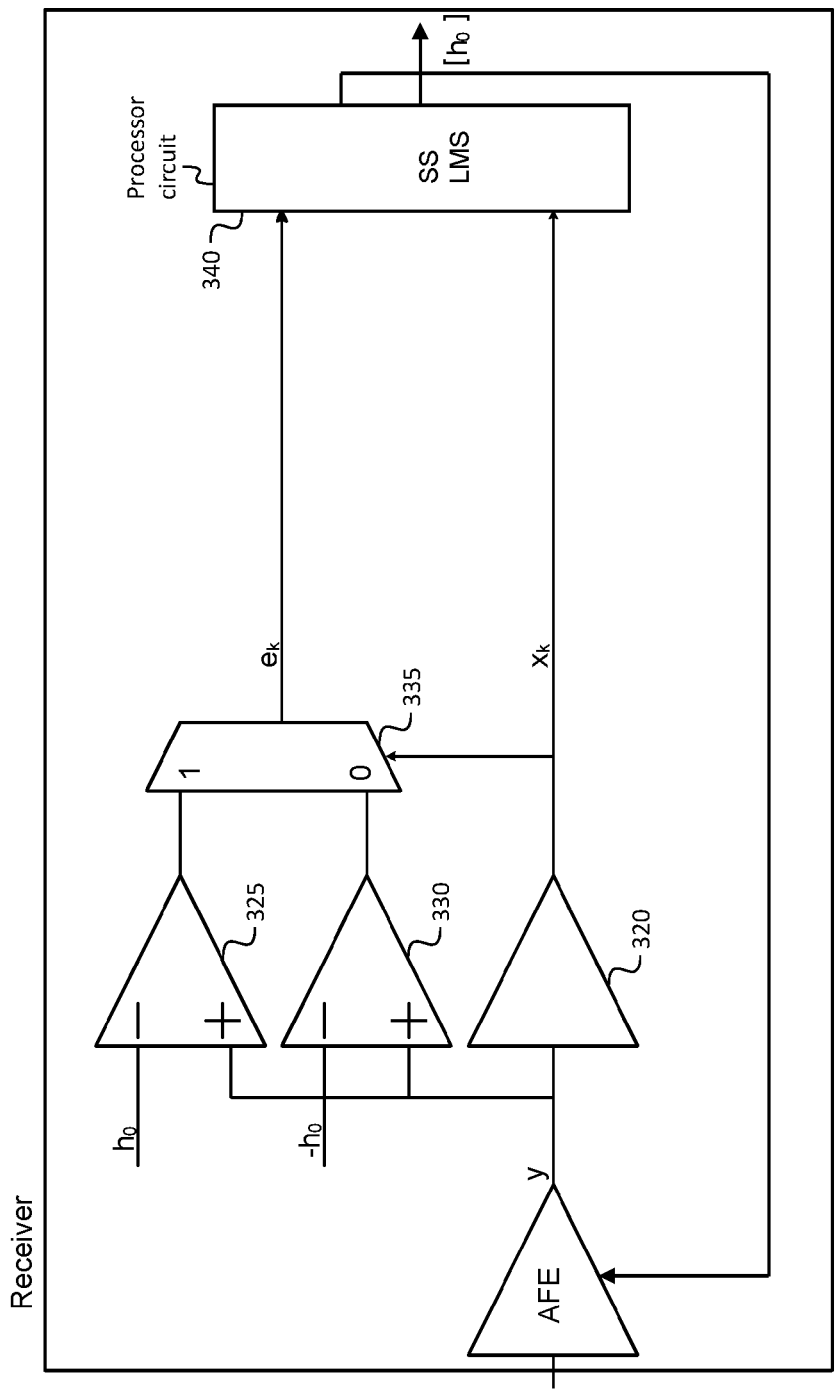
FIG. 3B is a block diagram of a system for estimating a zeroth channel tap, according to an embodiment of the present invention.

Referring to FIG. 3B, in one embodiment a generalized form of the embodiment of FIG. 2 may be implemented by disabling the DFE of the embodiment of FIG. 3A. The first error slicer 325 acts as described for the error slicer of the embodiment of FIG. 2. The second error slicer generalizes this behavior to take into account samples for which the data value is binary 0 (arithmetic −1). The multiplexer 335 then selects either (i) the output of the first error slicer 325 if the data value is 1, or (ii) the output of the second error slicer 330 if the data value is 0 (arithmetic 1). As such, this combination calculates the term Error (labelled ek in FIG. 3B) of the adaptation algorithm, which is equal to the sign of (y−h0(n)) when Data is 1, and the sign of (y+h0(n)) when Data is 0. The sign-sign least mean square (SS LMS) block 340, executing in the processor circuit 350, then executes the adaptation algorithm equation (Equation (1)), and updates the estimate of h0 with the result.

In the embodiment of FIG. 3B, disabling all taps except the zeroth tap may result in power savings, and may increase the likelihood of the algorithm converging. In some embodiments the channel tap values for these other taps (other than the zeroth tap) are not estimated during the process of setting the AFE gain, and the DFE connections (that during operation may provide corrections corresponding to tap values other than the zeroth tap value) are disconnected during the process of setting the AFE gain. In some embodiments the process of setting the AFE gain is performed while random data are received by the receiver; in other embodiments the transmitter is configured to transmit a half-rate clock (i.e., a data stream composed of (e.g., consisting of) alternating ones and zeros) on the channel during the process of setting the AFE gain.

Figure 4:
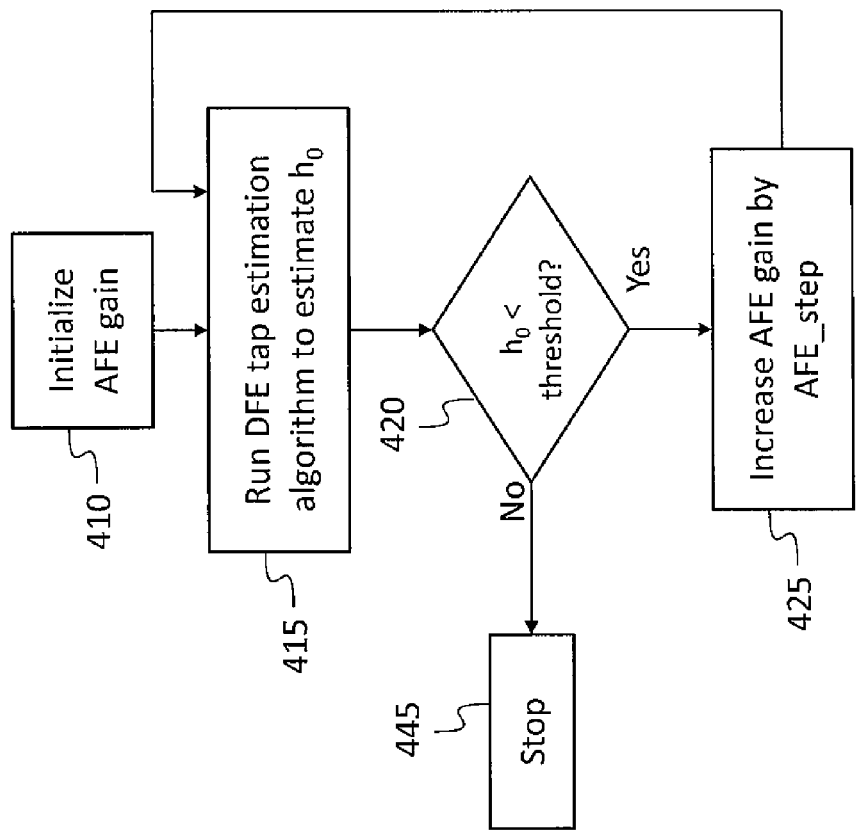
FIG. 4 is a flow chart of a method for adjusting an analog front end gain in a serial link, according to an embodiment of the present invention.

Referring to FIG. 4, in one embodiment a method for setting the DC gain of an AFE includes, in an act 410, initializing the AFE gain to a first value, e.g., to a sufficiently low value that the receiver does not saturate. In an act 415, DFE tap estimation is performed, e.g., using the algorithm of Equation (1), over a number of iterations. In an act 420, the estimated value of $h_0$ is tested against a threshold; if the estimated value of $h_0$ is less than the threshold, the AFE gain is increased, in an act 425, by a set or fixed amount or increment ("AFE_step") and execution loops back to act 415; if the estimated value of $h_0$ is not less than the threshold, the process terminates, in an act 445, and the AFE gain remains set to the current value during operation of the receiver.

Figure 5:
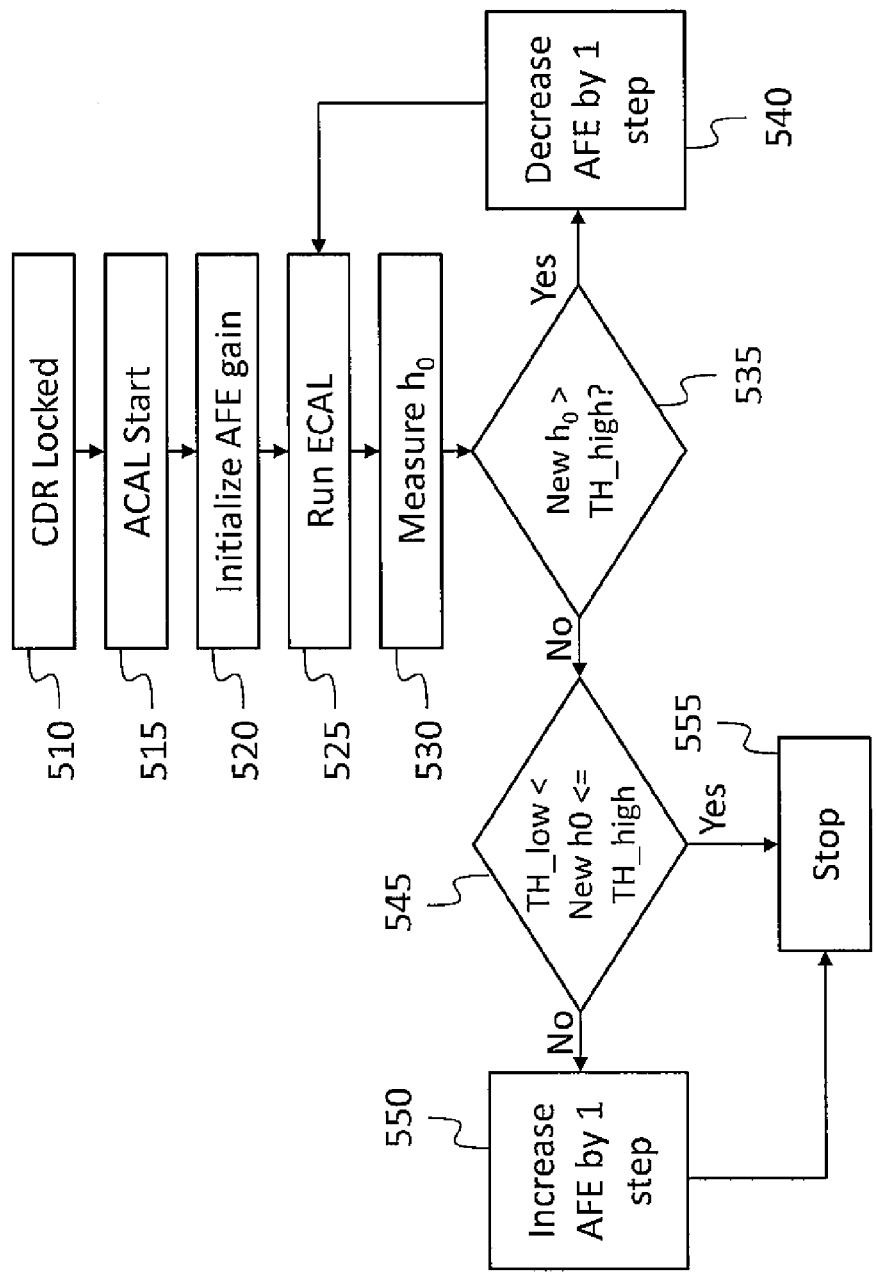
FIG. 5 is a flow chart of a method for adjusting an analog front end gain in a serial link, according to another embodiment of the present invention.

Referring to FIG. 5, in another embodiment the AFE gain is initially set to a first value (which may be a large value) in an act 520, which follows locking (act 510) of the clock and data recovery (CDR) circuit and start (act 515) of the AFE gain calibration process (ACAL). In an act 525, DFE tap estimation is performed (in a process referred to as ECAL), e.g., using the algorithm of Equation (1), over a number of iterations. In an act 530, the estimated value of $h_0$ is determined (as the result of the process of act 525). In an act 535, the estimated value of $h_0$ is tested against a first, higher threshold ("TH_high"); if the estimated value of $h_0$ is greater than the first threshold, the AFE gain is decreased, in an act 540, by one step (e.g., by a set or fixed amount or increment) and execution loops back to act 525. If the estimated value of $h_0$ is not greater than the first threshold, then, in an act 545, the estimated value of $h_0$ is tested against a second, lower threshold ("TH_low"); if the estimated value of $h_0$ is greater than the second threshold, the process terminates, in an act 555, and the AFE gain remains set to the current value during operation of the receiver. If in the act 545 it is determined that the estimated value of $h_0$ is greater than the second threshold, the AFE gain is increased, in an act 550, by one step (e.g., by a set or fixed amount or increment), and the process terminates, in an act 555, and the AFE gain remains set to the current value during operation of the receiver.

Figure 6:
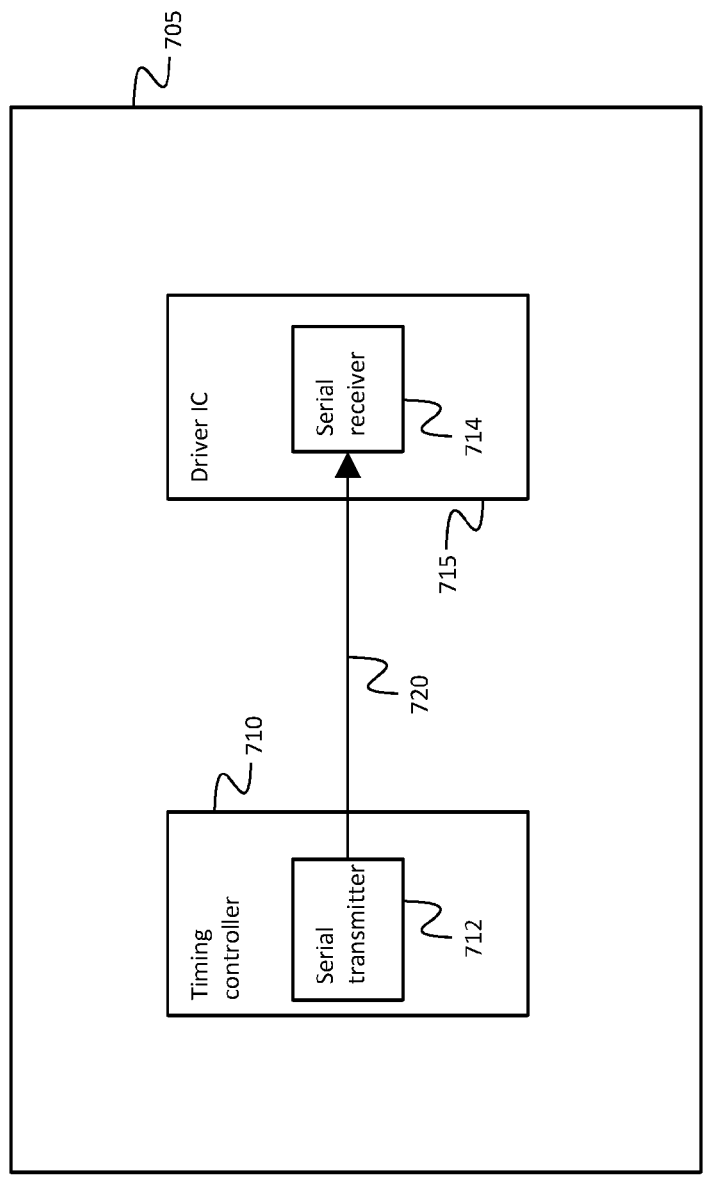
FIG. 6 is a block diagram of a display, according to an embodiment of the present invention.

Referring to FIG. 6, in one embodiment, a display 705 contains a timing controller 710 including a serial transmitter 712 configured to send high-speed digital data to a serial receiver 714 in a driver integrated circuit (driver IC) 715, over a non-ideal (e.g., lossy) channel 720. The receiver 714 includes an AFE with an adjustable DC gain. The receiver 714 includes a system for setting the DC gain of the AFE according to an embodiment of the present invention. Here, in embodiments of the present invention, the display is an organic light emitting diode (OLED) display or a liquid crystal display (LCD).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

The system and method for setting analog front end DC gain and/or any other relevant devices or components according to embodiments of the present invention described herein may be implemented utilizing any suitable hardware, firmware (e.g. an application-specific integrated circuit), software, or a combination of software, firmware, and hardware. For example, the various components of the system and method for setting analog front end DC gain may be formed on one integrated circuit (IC) chip or on separate IC chips. Further, the various components of the system and method for setting analog front end DC gain may be implemented on a flexible printed circuit film, a tape carrier package (TCP), a printed circuit board (PCB), or formed on one substrate. Further, the various components of the system and method for setting analog front end DC gain may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

The term "processor circuit" (or "processor unit") is used herein to include any combination of hardware, firmware, and software, employed to process data or digital signals. Processor circuit hardware may include, for example, application specific integrated circuits (ASICs), general purpose or special purpose central processor units (CPUs), digital signal processors (DSPs), graphics processor units (GPUs), and programmable logic devices such as field programmable gate arrays (FPGAs). In a processor circuit, as used herein, each function is performed either by hardware configured, i.e., hard-wired, to perform that function, or by more general purpose hardware, such as a CPU, configured to execute instructions stored in a non-transitory storage medium. A processor circuit may be fabricated on a single printed circuit board (PCB) or distributed over several interconnected PCBs. A processor circuit may contain other processor circuits; for example a processor circuit may include two processor circuits, an FPGA and a CPU, interconnected on a PCB.

Although exemplary embodiments of a system and method for setting analog front end DC gain have been specifically described and illustrated herein, many modifications and variations will be apparent to those skilled in the art. Accordingly, it is to be understood that a system and method for setting analog front end DC gain constructed according to principles of this invention may be embodied other than as specifically described herein. The invention is also defined in the following claims, and equivalents thereof.

What is claimed is:

1. A receiver for a serial link, the receiver having an analog input and comprising:
   an analog front end connected to the analog input and having an output and an adjustable DC gain;
   a data slicer having an input coupled to the output of the analog front end, and an output;
   an error slicer having an input coupled to the output of the analog front end, and an output; and
   a processor circuit coupled to the outputs of the data slicer and the error slicer and configured to iteratively adjust the DC gain based on a respective estimate of a zeroth channel tap value until the zeroth channel tap value falls into a set range of values,
   wherein the estimating of the zeroth channel tap value comprises iteratively updating the estimated zeroth channel tap value according to the equation:

$$h_0(n+1) = h_0(n) + mu * \text{Error} * \text{Data},$$

wherein:
   $h_0(n+1)$ is an updated estimate of the zeroth channel tap value;

$h_0(n)$ is a previous estimate of the zeroth channel tap value;

mu is a constant;

Data is the sign of a most recently received data bit; and

Error is the sign of:

$y-h_0(n)$ when Data is 1, and $y+h_0(n)$ when Data is 0, wherein y is an analog signal at the output of the analog front end.

2. The receiver of claim 1, wherein the iterative adjusting of the DC gain comprises initializing the DC gain to a first value, and increasing the DC gain with each iteration if a new estimated zeroth channel tap value is less than a threshold.

3. The receiver of claim 2, wherein the increasing the DC gain with each iteration comprises increasing the DC gain by a set increment.

4. The receiver of claim 2, wherein the first value is a sufficiently low value to avoid saturation of the receiver.

5. The receiver of claim 1, wherein the iterative adjusting of the DC gain comprises initializing the DC gain to a second value, and decreasing the DC gain by fixed increments if a new estimated zeroth channel tap value is greater than a second threshold.

6. The receiver of claim 5, wherein the iterative adjusting of the DC gain further comprises increasing the DC gain by a fixed increment if a new estimated zeroth channel tap value is less than or equal to the second threshold and greater than a third threshold.

7. A display comprising:

a transmitter; and a receiver connected to the transmitter, the receiver having an analog input comprising:

an analog front end connected to the analog input and having an output and an adjustable DC gain;

a data slicer having an input coupled to the output of the analog front end, and an output;

an error slicer having an input coupled to the output of the analog front end, and an output; and a processor circuit coupled to the outputs of the data slicer and the error slicer and configured to iteratively adjust the DC gain based on a respective estimate of a zeroth channel tap value until the zeroth channel tap value falls into a set range of values, wherein the estimating of the zeroth channel tap value comprises iteratively updating the estimated zeroth channel tap value according to the equation:

$$h_0(n+1)=h_0(n)+mu*\text{Error}*\text{Data},$$

wherein:

$h_0(n+1)$ is an updated estimate of the zeroth channel tap value;

$h_0(n)$ is a previous estimate of the zeroth channel tap value;

mu is a constant;

Data is the sign of a most recently received data bit; and

Error is the sign of:

$y-h_0(n)$ when Data is 1, and $y+h_0(n)$ when Data is 0, wherein y is an analog signal at the output of the analog front end.

8. The display of claim 7, wherein the iterative adjusting of the DC gain comprises initializing the DC gain to a first value, and increasing the DC gain with each iteration if a new estimated zeroth channel tap value is less than a threshold.

9. The display of claim 8, wherein the increasing the DC gain with each iteration comprises increasing the DC gain by a set increment.

10. The display of claim 8, wherein the first value is a sufficiently low value to avoid saturation of the receiver.

11. The display of claim 7, wherein the iterative adjusting of the DC gain comprises initializing the DC gain to a second value, and decreasing the DC gain by fixed increments if a new estimated zeroth channel tap value is greater than a second threshold.

12. The display of claim 11, wherein the iterative adjusting of the DC gain further comprises increasing the DC gain by a fixed increment if a new estimated zeroth channel tap value is less than or equal to the second threshold and greater than a third threshold.

13. The display of claim 7, wherein the transmitter is configured to transmit, during the estimating of the zeroth channel tap value, a signal comprising alternating binary ones and zeros.

14. A method of initializing a serial link comprising a transmitter and a receiver connected to the transmitter, the receiver having an analog input and comprising:

an analog front end connected to the analog input and having an output and an adjustable DC gain;

a data slicer having an input coupled to the output of the analog front end, and an output;

an error slicer having an input coupled to the output of the analog front end, and an output; and a processor circuit coupled to the outputs of the data slicer and the error slicer, the method comprising:

iteratively adjusting the DC gain, based on estimating, by the processor circuit, a respective zeroth channel tap value until the zeroth channel tap value falls into a set range of values, wherein the estimating of the zeroth channel tap value comprises iteratively updating the estimated zeroth channel tap value according to the equation:

$$h_0(n+1)=h_0(n)+mu*\text{Error}*\text{Data},$$

wherein:

$h_0(n+1)$ is an updated estimate of the zeroth channel tap value;

$h_0(n)$ is a previous estimate of the zeroth channel tap value;

mu is a constant;

Data is the sign of a most recently received data bit; and

Error is the sign of:

$y-h_0(n)$ when Data is 1, and $y+h_0(n)$ when Data is 0, wherein y is an analog signal at the output of the analog front end.

15. The method of claim 14, wherein the iterative adjusting of the DC gain comprises initializing the DC gain to a first value, and increasing the DC gain with each iteration if a new estimated zeroth channel tap value is less than a threshold.

16. The method of claim 15, wherein the increasing the DC gain with each iteration comprises increasing the DC gain by a set increment.

17. The method of claim 15, wherein the first value is a sufficiently low value to avoid saturation of the receiver.

18. The method of claim 14, wherein the iterative adjusting of the DC gain comprises initializing the DC gain to a second value, and decreasing the DC gain by fixed increments if a new estimated zeroth channel tap value is greater than a second threshold.

19. The method of claim 18, wherein the iterative adjusting of the DC gain further comprises increasing the DC gain by a fixed increment if a new estimated zeroth channel tap value is less than or equal to the second threshold and greater than a third threshold.

20. The method of claim 14, further comprising:
  transmitting, by the transmitter, during the estimating of the zeroth channel tap value, a signal comprising alternating binary ones and zeros.

* * * * *